United States Patent
Fuchi

(10) Patent No.: US 11,522,336 B2
(45) Date of Patent: Dec. 6, 2022

(54) THERMOELECTRIC COOLER BUILT-IN STEM

(71) Applicant: Mitsubishi Electric Corporation, Tokyo (JP)

(72) Inventor: Takahiro Fuchi, Isahaya (JP)

(73) Assignee: Mitsubishi Electric Corporation, Tokyo (JP)

( * ) Notice: Subject to any disclaimer, the term of this patent is extended or adjusted under 35 U.S.C. 154(b) by 365 days.

(21) Appl. No.: 16/954,969

(22) PCT Filed: Feb. 6, 2018

(86) PCT No.: PCT/JP2018/003913
§ 371 (c)(1),
(2) Date: Jun. 17, 2020

(87) PCT Pub. No.: WO2019/155505
PCT Pub. Date: Aug. 15, 2019

(65) Prior Publication Data
US 2020/0313387 A1    Oct. 1, 2020

(51) Int. Cl.
*H01S 5/024*     (2006.01)
*H01S 5/0231*    (2021.01)
(Continued)

(52) U.S. Cl.
CPC ........ *H01S 5/02415* (2013.01); *H01S 5/0231* (2021.01); *H01S 5/0232* (2021.01);
(Continued)

(58) Field of Classification Search
CPC ............. H01S 5/02415; H01S 5/02212; H01S 5/0231; H01S 5/02315; H01S 5/0232;
(Continued)

(56) References Cited

U.S. PATENT DOCUMENTS 5,005,178 A * 4/1991 Kluitmans ........... G02B 6/4202
                                                          372/38.1
6,252,726 B1 * 6/2001 Verdiell .............. H01S 5/02208
                                                           385/94
(Continued)

FOREIGN PATENT DOCUMENTS

JP    S59-193080 A    11/1984
JP    H08-125282 A    5/1996
(Continued)

OTHER PUBLICATIONS

International Search Report issued in PCT/JP2018/003913; dated Apr. 3, 2018.
(Continued)

*Primary Examiner* — M. A. Golub-Miller
(74) *Attorney, Agent, or Firm* — Studebaker & Brackett PC

(57) ABSTRACT

Provided is a thermoelectric cooler built-in stem, including a first stem member on a top face of which a temperature controlled target device such as an optical module or the like is mounted, a second stem member which opposes to the first stem member each other, and a thermoelectric cooler being sandwiched between the first stem member and the second stem member, for controlling the temperature controlled target device, whereby a space between the first stem member and the second stem member is filled by an insulating resin whose thermal conductivity is low.

9 Claims, 8 Drawing Sheets

(51) Int. Cl.
  *H01S 5/0232* (2021.01)
  *H01S 5/0235* (2021.01)
  *H01S 5/02315* (2021.01)
  *H01S 5/02234* (2021.01)
  *H01S 5/022* (2021.01)
  *H01S 5/023* (2021.01)
  *H01S 5/02212* (2021.01)
  *H01S 5/02208* (2021.01)

(52) U.S. Cl.
  CPC ........ *H01S 5/0235* (2021.01); *H01S 5/02212* (2013.01); *H01S 5/02234* (2021.01); *H01S 5/02315* (2021.01); *H01S 5/02476* (2013.01); *H01S 5/022* (2013.01); *H01S 5/023* (2021.01); *H01S 5/02208* (2013.01)

(58) Field of Classification Search
  CPC .... H01S 5/0235; H01S 5/02476; H01S 5/022; H01S 5/02208; H01S 5/023
  See application file for complete search history.

(56) References Cited

U.S. PATENT DOCUMENTS

| | | | | |
|---|---|---|---|---|
| 6,519,157 | B1* | 2/2003 | Xing | H01S 5/02415 165/185 |
| 10,707,642 | B2* | 7/2020 | Hettier | H01S 5/022 |
| 2003/0043868 | A1* | 3/2003 | Stewart | H01S 5/02212 372/36 |
| 2004/0240498 | A1* | 12/2004 | Akamatsu | H04N 9/3144 348/E9.027 |
| 2005/0207459 | A1* | 9/2005 | Yu | H01L 31/0203 257/E31.118 |
| 2006/0165353 | A1* | 7/2006 | Miao | H01S 5/02212 385/88 |
| 2007/0120134 | A1 | 5/2007 | Oshima et al. | |
| 2009/0059979 | A1* | 3/2009 | Tanaka | H01S 5/0612 372/36 |
| 2014/0328595 | A1* | 11/2014 | Han | H04B 10/2575 398/115 |
| 2015/0303652 | A1* | 10/2015 | Choi | H01S 5/02326 372/34 |
| 2017/0125972 | A1* | 5/2017 | Kim | H01S 5/0234 |

FOREIGN PATENT DOCUMENTS

| | | |
|---|---|---|
| JP | H09-325247 A | 12/1997 |
| JP | 2000-188430 A | 7/2000 |
| JP | 2001-326412 A | 11/2001 |
| JP | 2005-050844 A | 2/2005 |
| JP | 2006-210935 A | 8/2006 |
| JP | 2007-150182 A | 6/2007 |
| JP | 2014-157898 A | 8/2014 |

OTHER PUBLICATIONS

An Office Action mailed by the Korean Intellectual Property Office dated Jun. 7, 2021, which corresponds to Korean Patent Application 10-2020-7021740 and is related to U.S. Appl. No. 16/954,969; with English language translation.

* cited by examiner

THERMOELECTRIC COOLER BUILT-IN STEM

TECHNICAL FIELD

The present invention relates to a thermoelectric cooler built-in stem which implements therein a temperature control function of an optical module.

BACKGROUND ART

Conventionally, in a coaxial cooled optical module including a thermoelectric cooler (hereinafter, may also be referred to as a "TEC," Thermoelectric Cooler) and an optical constituent element(s) or component(s), a TEC is mounted on a stem's upper face (may also be referred to as an upper face of an "eyelet"), and an optical component and other components are packaged so as to be accumulated on the TEC's upper face, so that a configuration of the coaxial cooled optical module is made (for example, refer to Patent Document 1).

In addition, disclosed is a configuration of an optical fiber module of a box type in which components are packaged on an upper face of a TEC (for example, refer to Patent Document 2). In addition, disclosed is a configuration in which a light-emitting element (s) used as a light source is made easier to be attached to a Peltier device (for example, refer to Patent Document 3). Moreover, disclosed is a configuration of a stem for use in an optical device in which interference with protruded portions in the circumferences of lead electrodes is eliminated, and high-frequency propagation losses are reduced (for example, refer to Patent Document 4). Furthermore, disclosed is a configuration in which, by using a conventional CAN package, a Peltier element is placed under a stem so that the entirety of a device is cooled (for example, refer to Patent Document 5).

RELATED ART DOCUMENTS

Patent Documents

[Patent Document 1] Japanese Patent Laid-Open No. 2006-210935
[Patent Document 2] Japanese Patent Laid-Open No. H09-325247
[Patent Document 3] Japanese Patent Laid-Open No. 2014-157898
[Patent Document 4] Japanese Patent Laid-Open No. 2007-150182
[Patent Document 5] Japanese Patent Laid-Open No. 2005-50844

SUMMARY OF THE INVENTION

Problems to be Solved by the Invention

According to those conventional schemes, it is necessary to accumulate an optical component upon a thermoelectric cooler itself, and so, an optical axis of the optical component is not kept stable due to stress or the like by a mounted component (s), whereby there exists a possibility of giving rise to an influence on a characteristic (s) of the optical component, such as variation or the like of its optical path, related to the optical axis. In addition, there arises a problem in that the stress with respect to a thermoelectric element of the thermoelectric cooler is also large, and so, the thermoelectric cooler may be given rise to its breakdown due to disturbances such as a striking impact(s) of a drop, vibrations and/or the like.

The explanation will be made in more detail below referring to FIG. 8 for these problems. In a case in which an optical module is configured, an optical component 7 therein is required to be mounted at a position directly above a thermoelectric cooler 5, for example, as shown in FIG. 8. In this case, the height from a stem 20 becomes larger, so that its attitude is likely to get in an unstable state, and so, a malfunction related to the optical axis is concerned in such a case that, due to thermal stress or the like, the optical axis of an LD chip 10 being one component of the optical component 7 becomes easy to be displaced, or the like.

In addition, because the self weight of accumulated components used for the optical component 7 is applied with respect to the thermoelectric cooler 5, the stress added to the thermoelectric cooler 5 becomes larger when vibrations and/or a striking impact(s) are additionally applied thereto, so that it becomes easier to cause breakdown of a thermoelectric element 5a taking on a support column of the thermoelectric cooler 5, and/or to bring peeling from a joining portion between a substrate 5b of the thermoelectric cooler 5 and the stem 20.

In particular, when the thermoelectric cooler 5 and the stem 20 are bonded by an electrically conductive resin, a possibility of their peeling due to a striking impact (s) becomes higher.

Note that, leads 3a for supplying an electrical signal to the LD chip, and leads 3b for supplying an electrical signal to the thermoelectric cooler 5 are attached on the stem 20 so as to protrude from the upper face of the stem 20. In addition, the leads 3b are connected to the substrate 5b of the thermoelectric cooler 5 at a connection-point portion 4.

In order to solve the problems described above, in the present invention, an object of the invention is to achieve a thermoelectric cooler built-in stem in which a temperature control function of an optical module of a CAN type is implemented as one function of the stem, and in particular to achieve the thermoelectric cooler built-in stem that curbs the occurrence of characteristic variation related to an optical axis, such as positional variation or the like of the optical axis, due to stress variation or the like with respect to a member(s). In addition, particularly, another object of the invention is to achieve a thermoelectric cooler built-in stem in which, in order to curb breakdown of the thermoelectric cooler due to an influence of external atmospheric air, an extended contour line of a constituent component being built-in in one member of the stem is configured to surround the thermoelectric cooler.

Means for Solving the Problems

A thermoelectric cooler built-in stem according to the present invention is a stem residing in a feature that comprises:

a first stem member for mounting a temperature controlled target device on a top face of the first stem member further having an annular resin mold portion therein, being molded with a resin in a cylindrical shape, whose outer lateral portion in a cylindrical shape directly receiving an influence of a temperature of external atmospheric air;

a second stem member being placed on a side of a bottom face of the first stem member, and sandwiching, in-between the first stem member, a thermoelectric cooler for performing temperature control of the temperature-controlled target device; and an insulating resin surrounding the thermoelectric cooler, and also being filled between the first stem member and the second stem member;

a lead extending through the second stem member and interconnecting the first stem member, and also supplying an electrical signal to the temperature-controlled target device; and other leads than said lead which are extending through the second stem member, and are joined to an anode and a cathode being electrodes of the thermoelectric cooler, wherein the annular resin mold portion is formed to extend through the first stem member in an across-a-thickness direction thereof, whereby the first stem member is thermally separated into the first stem member's outer lateral portion disposed outside of the annular resin mold portion in a ring and a first stem member's inner lateral portion disposed inside of the annular resin mold portion in a ring; and also an entirety of the thermoelectric cooler is placed at a position directly below the inside of the annular resin mold portion in a ring.

Effects of the Invention

The thermoelectric cooler built-in stem according to the present invention can make smaller the height of a mounted component(s) and its size on a stem's upper face, and, by reducing stress variation exerting to the component(s), an influence on characteristic variation thereof related to an optical axis of an optical module can be curbed. In addition, it becomes possible to protect the thermoelectric cooler being built-in from disturbances such as a striking impact(s) of a drop, vibrations or the like. Moreover, the thermoelectric cooler can be controlled from outside of the thermoelectric cooler built-in stem, and also, by taking on the structure that is difficult to receive an influence of ambient temperature, it becomes possible to widen a temperature control range by means of the thermoelectric cooler.

EMBODIMENTS FOR CARRYING OUT THE INVENTION

Embodiment 1

Figure 1:
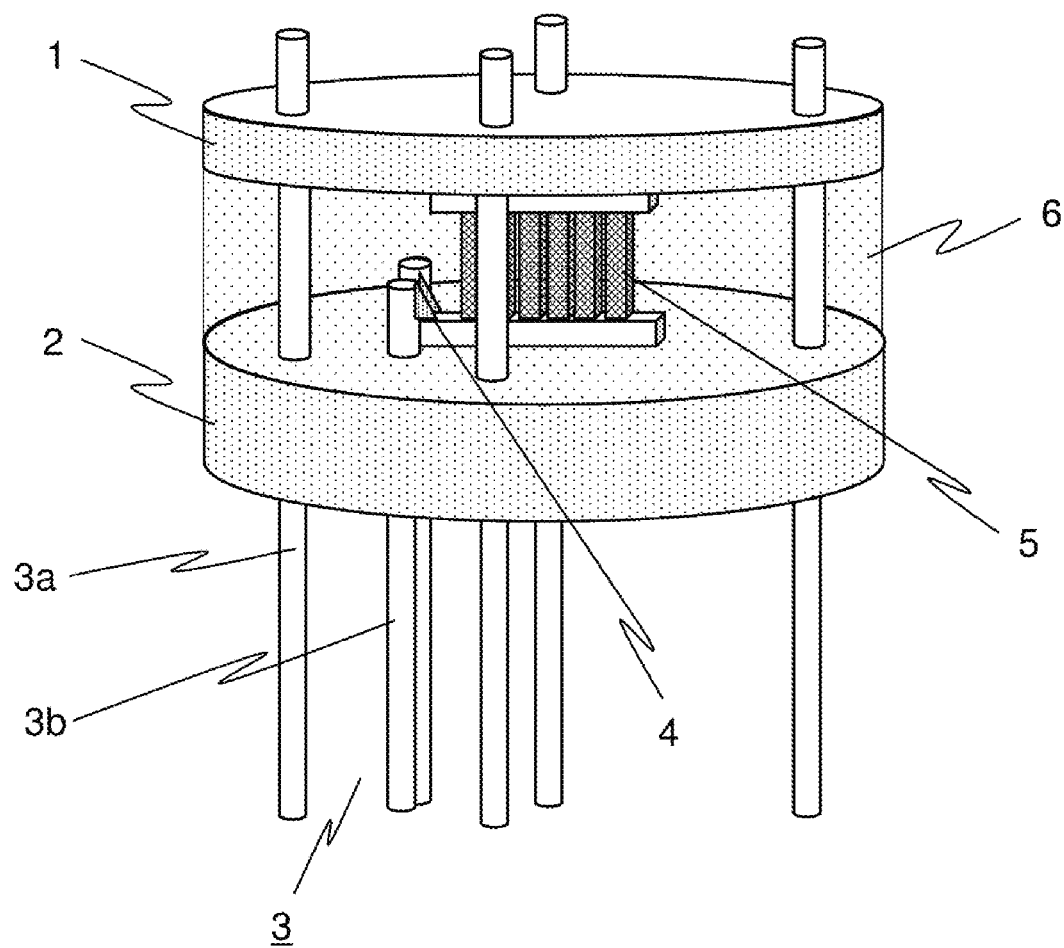
FIG. 1 is a diagram illustrating, by way of example, a thermoelectric cooler built-in stem according to Embodiment 1 of the present invention.
Figure 2:
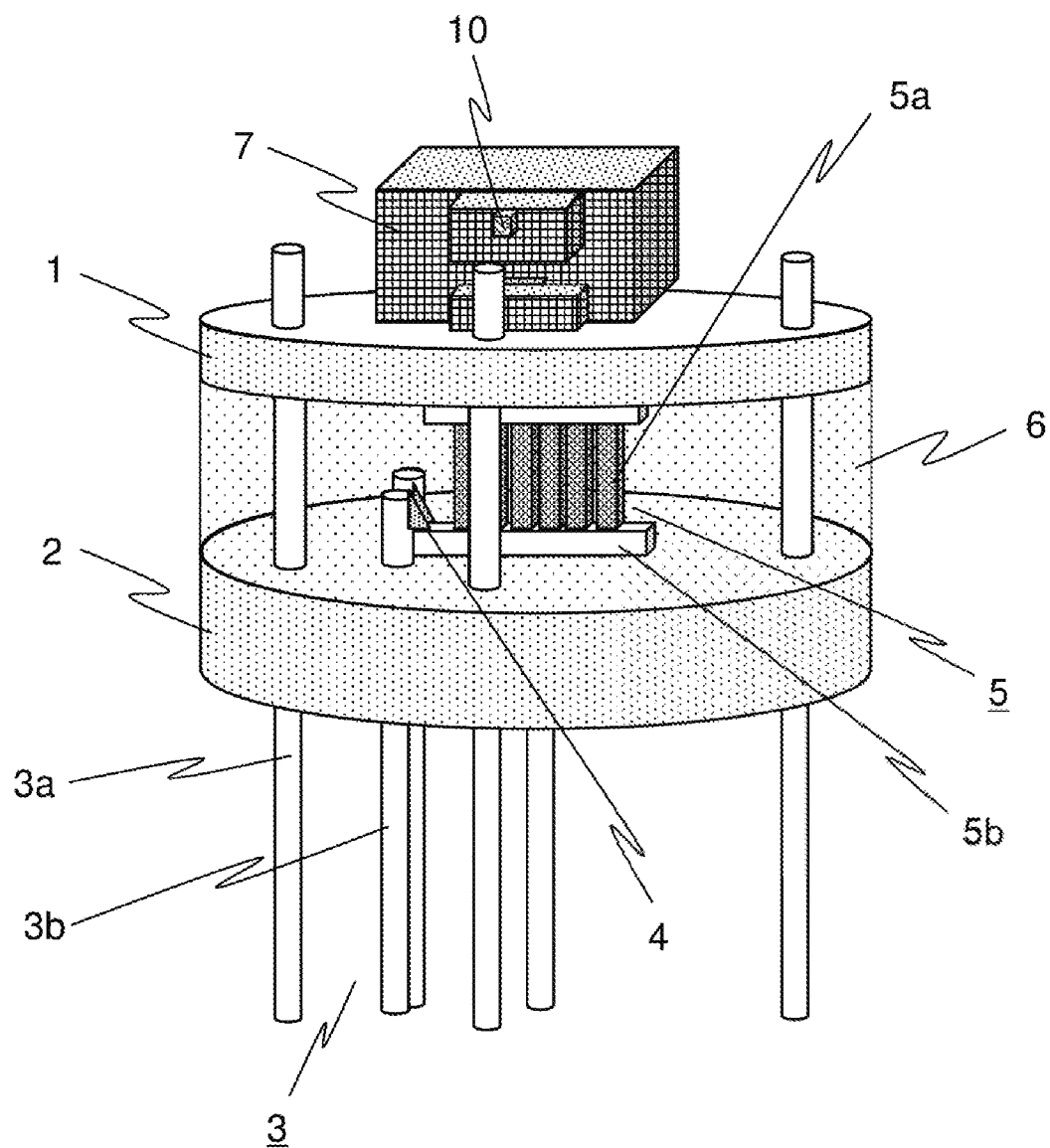
FIG. 2 is a diagram in which an optical module is mounted upon the thermoelectric cooler built-in stem according to Embodiment 1 of the present invention.

Hereinafter, the explanation will be made on the basis of the drawings for a thermoelectric cooler built-in stem according to Embodiment 1 of the present invention. FIG. 1 is a diagram illustrating, by way of example, the thermoelectric cooler built-in stem according to Embodiment 1 of the present invention. In addition, FIG. 2 is a diagram in which an optical module is mounted upon the thermoelectric cooler built-in stem according to Embodiment 1 of the present invention.

In FIG. 1, at a place on a directly bottom side of a first stem member 1 in a disk shape for mounting thereon a temperature controlled target component or device such as an optical module or the like, the thermoelectric cooler 5 (hereinafter, may also be referred to as the TEC 5: Thermoelectric Cooler) for cooling the optical module at an appropriate temperature is mounted on the top face of a second stem member 2 in a disk shape disposed so as to oppose the first stem member 1 in the same axial direction to each other. Here, the thermoelectric cooler 5 is joined on a surface of the first stem member 1 and that of the second stem member 2 by an electrically conductive material such as soldering solder, an electrically conductive resin, or the like.

In addition, for the first stem member 1 and the second stem member 2 described above, leads 3a for supplying an electrical signal to the optical module described above are provided to pass or extend through the two of stems along an axial direction of them. And then, as shown in FIG. 2, these leads 3a protrude above from the top face of the first stem member 1, whereby, by connecting them by using Au wires or the like (not shown in the figure) to an LD (laser diode; an abbreviation for "Laser Diode") chip 10 being one constituent component of the optical component 7 mounted on the top face of the first stem member 1, the control of operations from outside becomes possible.

In addition, the leads 3b for supplying an electrical signal to the thermoelectric cooler 5 described above are provided to pass or extend through the second stem member 2, and are connected to the substrate 5b of the thermoelectric cooler 5 at the connection-point portion 4.

Moreover, an anode and a cathode (not shown in the figures) being the electrodes of the thermoelectric cooler 5 are joined to the leads 3b at the connection-point portion 4 described above by means of soldering or the like. According to this arrangement, two terminals of the anode and the cathode described above can be used as controlling terminals (the electrodes) from outside of the thermoelectric cooler 5.

Furthermore, between the first stem member 1 and the second stem member 2 described above, an insulating resin 6 whose thermal conductivity is low is filled so as to thoroughly accommodate with it in a space between the first stem member 1 and the second stem member 2, or is filled therein so as to surround the thermoelectric cooler 5.

According to the arrangement, a role is achieved in which an influence of heat where the thermoelectric cooler 5 produces is separated between the first stem member 1 and the second stem member 2. Moreover, in addition to this, a role is achieved in which the thermoelectric cooler 5 is protected from disturbances due to a striking impact (s) of a drop, vibrations and/or the like.

Note that, the leads 3a which extend through the first stem member 1 and the second stem member 2 are disposed at four positions disengaged in an approximately equal interspace therebetween along appropriately the same radius of the first stem member 1 and that of the second stem member 2, and, together with the insulating resin 6, serve as reinforcement materials for protecting the thermoelectric cooler 5.

Next, the explanation will be made referring to FIG. 2 for the operations of the thermoelectric cooler built-in stem according to Embodiment 1, in a case in which a component other than the thermoelectric cooler 5 is configured on a surface of the first stem member 1.

As an example is shown in the figure, the optical component 7 that is a component other than the thermoelectric cooler 5 is exemplarily mounted upon the top face of the first stem member 1. Because the optical component 7 is mounted upon the top face of the first stem member 1, it becomes possible to reduce the height of a component from the stem by the amount of the height of the thermoelectric cooler 5.

Figure 8:
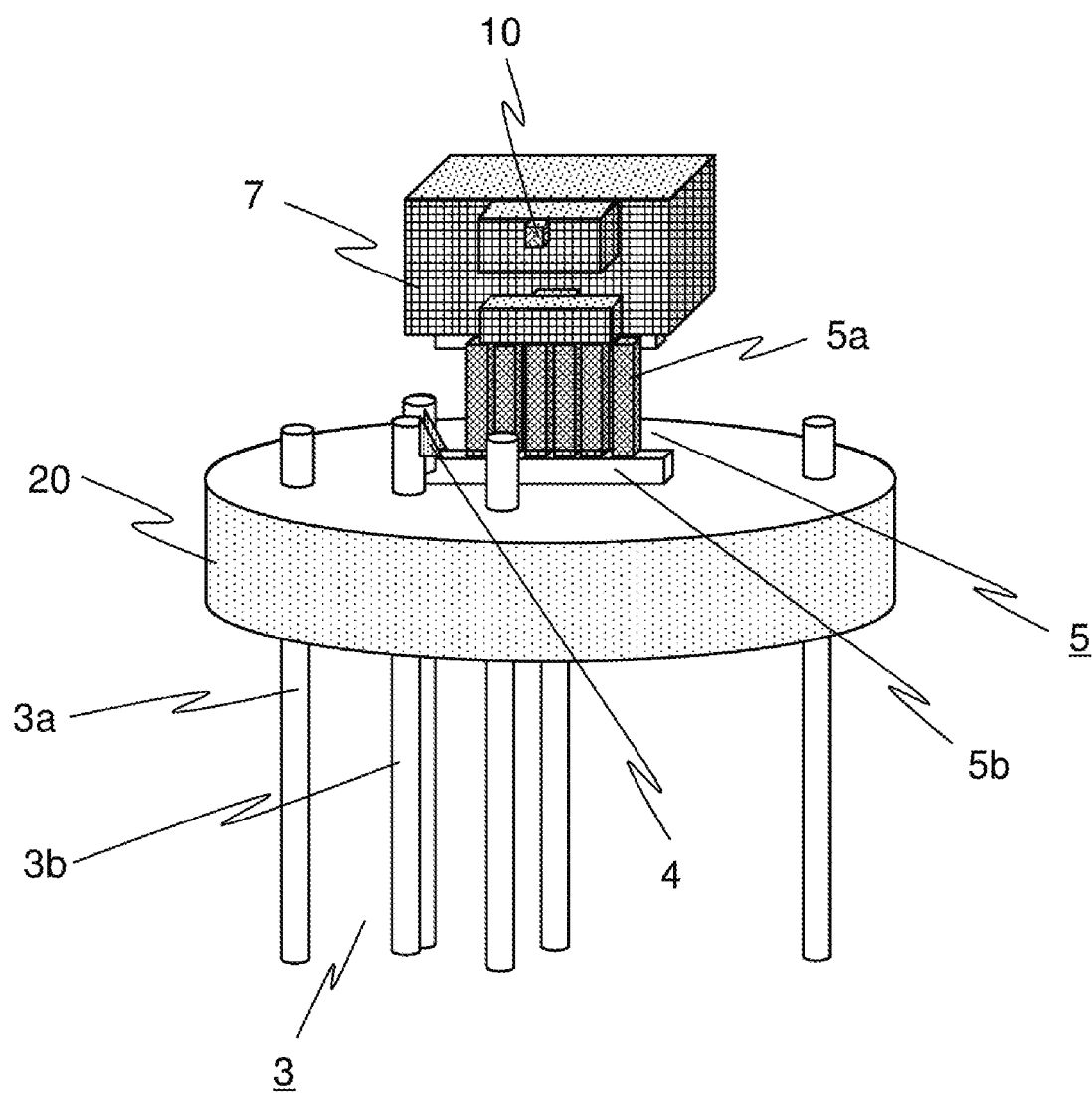
FIG. 8 is a diagram for explaining problems to the present invention.

Therefore, in comparison with a case shown in FIG. 8 in which the optical component 7 is directly placed on the thermoelectric cooler 5, an angular displacement, due to thermal stress or the like, of the optical axis of the LD chip 10 being one component of the optical component 7 is curbed, and thus, an occurrence ratio of a malfunction related to the optical axis can be reduced.

In addition, because the thermoelectric cooler 5 is covered in its perimeter by the insulating resin 6 whose thermal conductivity is low, and in addition, is reinforced by the leads 3a extending through both stems of the second stem member 2 and the first stem member 1, it is made possible to further enhance resistance to a striking impact(s), and that to vibration.

As explained above, in the thermoelectric cooler built-in stem according to Embodiment 1, the height of a mounted component(s) on a stem's upper face can be lowered, whereby it is possible to curb characteristic variation related to the optical axis as described above. Moreover, the thermoelectric cooler can be protected from disturbances such as a striking impact(s), vibrations and/or the like by means of filling a resin between the first stem member and the second stem member so as to directly cover the thermoelectric cooler, or to cover the periphery of the thermoelectric cooler, and by means of providing the leads 3a extending through the first stem member or the second stem member, or providing the leads 3b extending through the second stem member.

In the manner described above, the thermoelectric cooler is connected to the first stem member 1 or to the second stem member 2 by using solder, an electrically conductive resin or the like, and, in order to control the operations of the thermoelectric cooler, the leads 3b for supplying an electric current into the thermoelectric cooler extend through the second stem member 2 and take in shape to protrude above from the top face thereof. Here, the connections between the terminals of an anode and a cathode, each being an electrode of the thermoelectric cooler, and the respective leads 3b are performed by means of joining such as soldering or the like.

Meanwhile, in order to control the operations of the LD chip 10 being one component of the optical component 7 being the component mounted on the first stem member 1, the leads 3a for supplying an electric current are provided to extend through both of the first stem member 1 and the second stem member 2, and to doubly serve the roles to curb disturbances such as vibrations or the like with respect to the optical component 7.

In addition, a space between the first stem member (perimeter) and the second stem member (perimeter) (a space inside of a cylindrical-shaped body surrounded by the bottom face of the first stem member, the top face of the second stem member, and a curved plane interconnecting the perimeters of these two members to each other) is reinforced by means of filling an insulating resin; and, as for the manner to form the insulating resin, it is possible to form in either method of surrounding the thermoelectric cooler (in this case, a gap is caused between the insulating resin and the thermoelectric cooler), or method of thoroughly accommodating it by also filling a portion of the thermoelectric element 5a taking on a support column of the thermoelectric cooler. The insulating resin is a resin whose thermal conductivity is low, possessing insulation capabilities. According to these arrangements, it becomes possible to form a thermoelectric cooler built-in stem which has a function capable of performing a temperature control.

According to a roundup of the manner described above, the thermoelectric cooler built-in stem according to Embodiment 1 has clearly different features from the inventions according to the cited documents described above or a combination(s) thereof, in particular, in the following points.

The first point is that, differing from a conventional scheme to place a thermoelectric cooler outside of the stem, a form is achieved in which the stem demonstrating as a discrete device has, as one portion thereof, a thermoelectric cooler having cooling function. The second point is that, by forming the insulating resin in the perimeter of the thermoelectric cooler, the configuration is achieved as the thermoelectric cooler built-in stem. The third point is that, in order to protect the thermoelectric cooler, the leads passing or extending through the stem are utilized.

Embodiment 2

The explanation will be made below on the basis of FIG. 3 for a thermoelectric cooler built-in stem according to Embodiment 2 of the present invention.

Figure 3:
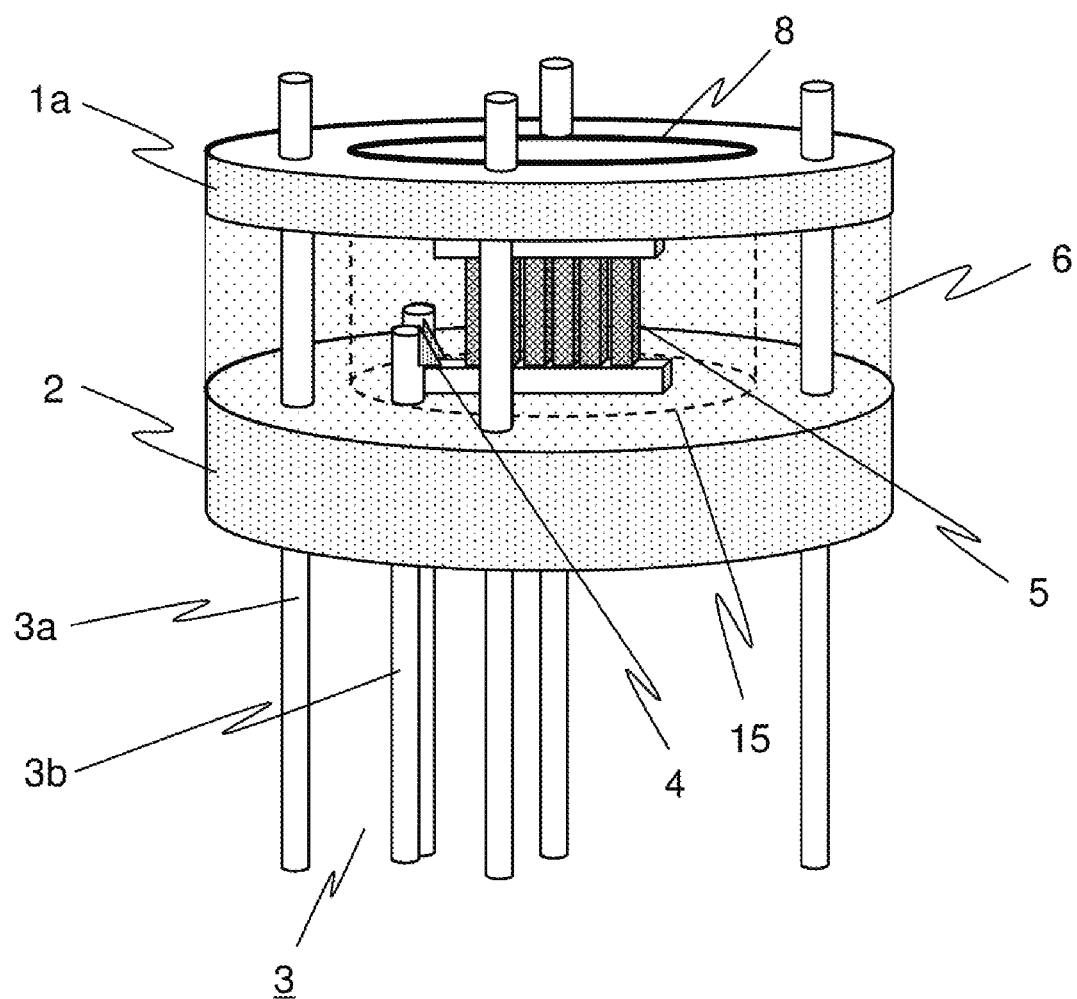
FIG. 3 is a diagram illustrating, by way of example, a thermoelectric cooler built-in stem according to Embodiment 2 of the present invention.

A different point to the thermoelectric cooler built-in stem explained in Embodiment 1 is that, as shown in FIG. 3, an annular resin mold portion 8 being a region molded in a ring shape by means of a resin is formed in a first stem member 1a. The annular resin mold portion 8 is a molded portion which is formed in the first stem member 1a in order to enhance the functions of the thermoelectric cooler. The explanation will be made in detail below for the thermoelectric cooler built-in stem according to Embodiment 2.

A region in which each component of an optical module (not shown in the figure) is packaged is being set inside of the annular resin mold portion 8 shown in FIG. 3. And then, by placing the entirety of the thermoelectric cooler 5 at the position directly below the inside, it is possible to add heat to the optical module by means of the thermoelectric cooler 5 by way of the first stem member 1a, or, on the contrary, to decrease heat therefrom. Note that, the aforementioned annular resin mold portion 8 formed in the first stem member 1a described above is configured in such a manner that an extended contour line 15 (refer to the broken lines in FIG. 3) of a ring-shaped or cylindrical contoured portion of the annular resin mold portion toward the insulating resin surrounds the thermoelectric cooler. More preferably, but not necessarily, the aforementioned annular resin mold portion 8 is placed at a position inside of a ring line which goes through the axial centers of the plurality of wire leads 3a.

In this case, an outer lateral portion of a ring where the annular resin mold portion 8 is formed directly receives an influence of a temperature of external atmospheric air; whereas, when there does not exist the annular resin mold portion 8, a case is conceivable in which the thermoelectric cooler 5 is likely to receive an influence of the external atmospheric air, so that the thermoelectric cooler 5 cannot sufficiently achieve its functions. For this reason, by forming the annular resin mold portion 8, an influence of a temperature of external atmospheric air with respect to the thermoelectric cooler 5 is made smaller.

Next, the explanation will be made for the operations of Embodiment 2.

Figure 4:
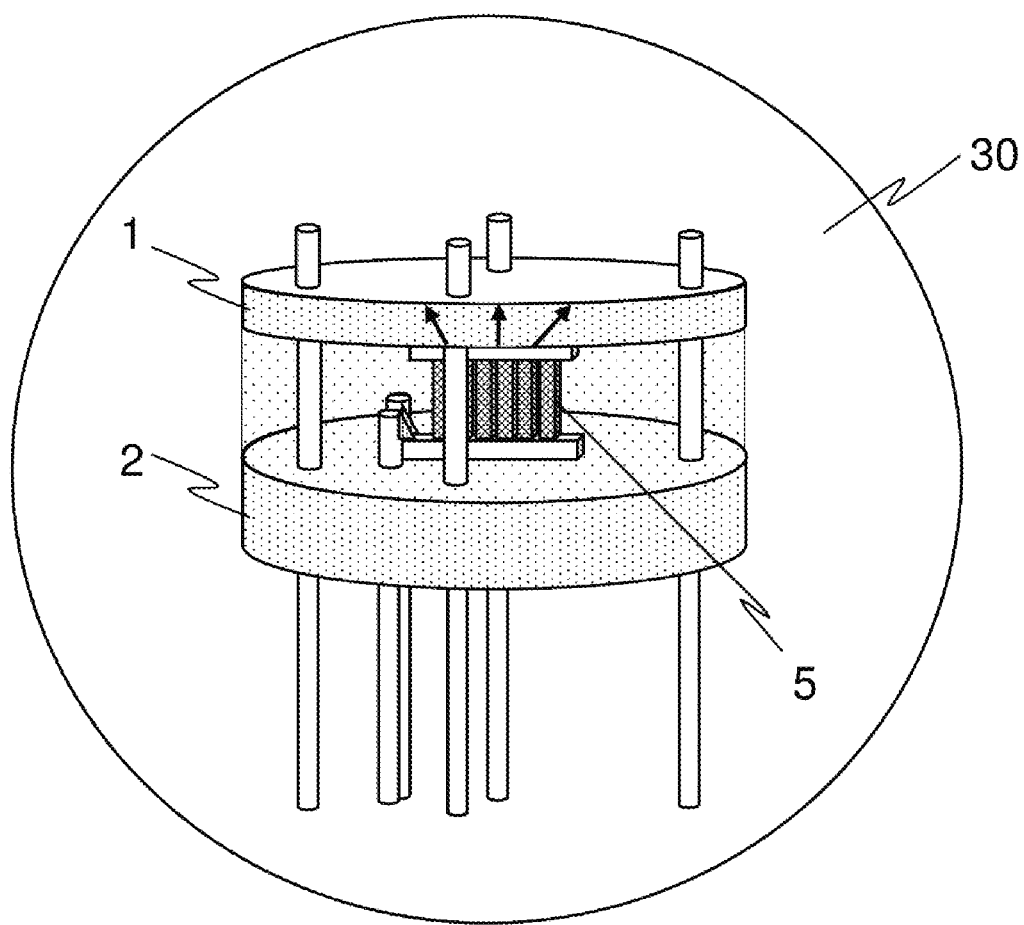
FIG. 4 is a diagram for explaining an influence of external atmospheric air on the thermoelectric cooler built-in stem according to Embodiment 1 of the present invention.

In a case in which the thermoelectric cooler built-in stem explained in Embodiment 1 of FIG. 4 is utilized, when a temperature of external atmospheric air 30 is higher than that of a device mounted in an optical module, a temperature of the bottom face of the first stem member 1 is decreased by cooling an upper face of the thermoelectric cooler 5, so that an overall temperature of the first stem member 1 is decreased by means of conduction of heat due to the difference of the temperature to that of the top face of the first stem member 1 (refer to the arrows in the figure); however, when the difference between a temperature of a device wanted to be driven and that of the external atmospheric air 30 is large, a case can be presumed in which the temperature is not decreased owing to lack of functions of the thermoelectric cooler 5.

Figure 5:
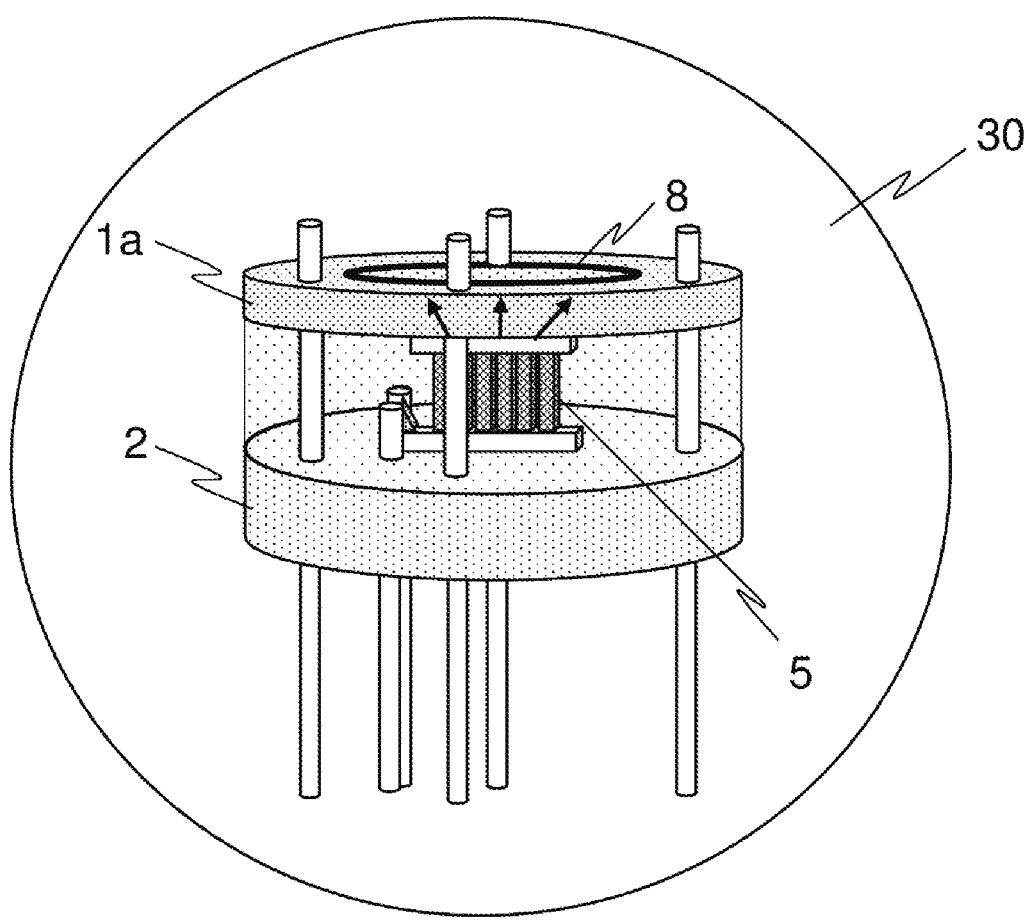
FIG. 5 is a diagram for explaining an influence of external atmospheric air on the thermoelectric cooler built-in stem according to Embodiment 2 of the present invention.

For this reason, the annular resin mold portion 8 is formed in the first stem member 1a in a ring shape as shown in FIG. 5. And then, by means of the annular resin mold portion 8, the structure (the explanation will be made in detail below) is taken on in that the first stem member 1a being easy to receive an influence of the external atmospheric air 30 is separated into an outer lateral portion to a ring of the annular resin mold portion 8 and an inner lateral portion, being difficult to receive the influence, to a ring of the annular resin mold portion 8, whereby the thermoelectric cooler 5 is made difficult to receive the influence owing to a temperature of the external atmospheric air 30, so that it becomes possible to sufficiently exert the capacity of the thermoelectric cooler 5.

Figure 6:
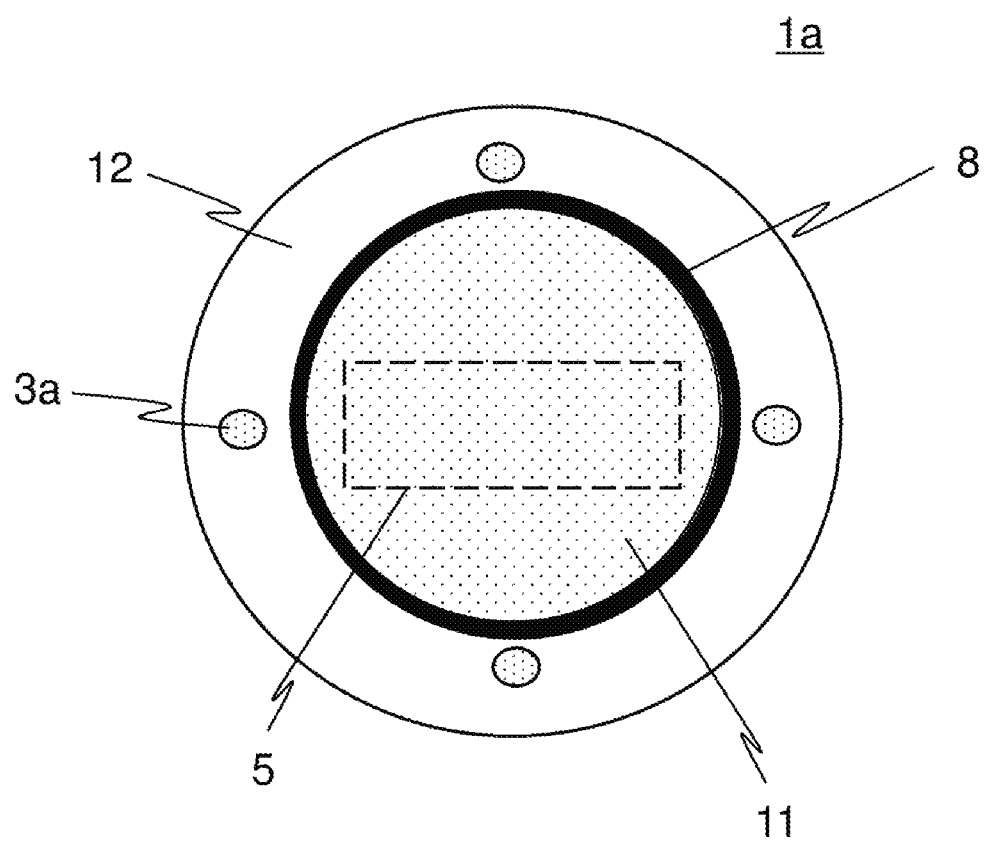
FIG. 6 is a top view for explaining in detail a structure of a first stem member of the thermoelectric cooler built-in stem in FIG. 3.

FIG. 6 is a top view for explaining in more detail the structure of the first stem member 1a, being viewed from the top side of the first stem member 1a described above.

In the figure, the leads 3a extending through the first stem member 1a and the second stem member 2 are disposed in the number of four mutually disengaged in an equal interspace therebetween at approximately the same radial positions outside of the annular resin mold portion 8 in the ring shape. In addition, the annular resin mold portion 8 is provided in a form to extend through the first stem member 1a in an across-the-thickness direction thereof.

Therefore, by means of the annular resin mold portion 8, the first stem member 1a is thermally separated into a first stem member's outer lateral portion 12 and a first stem member's inner lateral portion 11 from each other. As a result, by means of the thermoelectric cooler 5 (its contoured position is shown by the broken lines in the figure) whose upper face is bonded onto the bottom face of the first stem member's inner lateral portion 11, it is possible to perform a temperature control while separating a portion of the first stem member's inner lateral portion 11 from the first stem member's outer lateral portion 12.

According to the above, by forming the annular resin mold portion 8 in the first stem member 1a, and by taking on the structure that is difficult to receive an influence of ambient temperature, it becomes possible to widen a temperature control range by means of the thermoelectric cooler.

Embodiment 3

The explanation will be made below on the basis of FIG. 7 for an example of a thermoelectric cooler built-in stem according to Embodiment 3 of the present invention.

Figure 7:
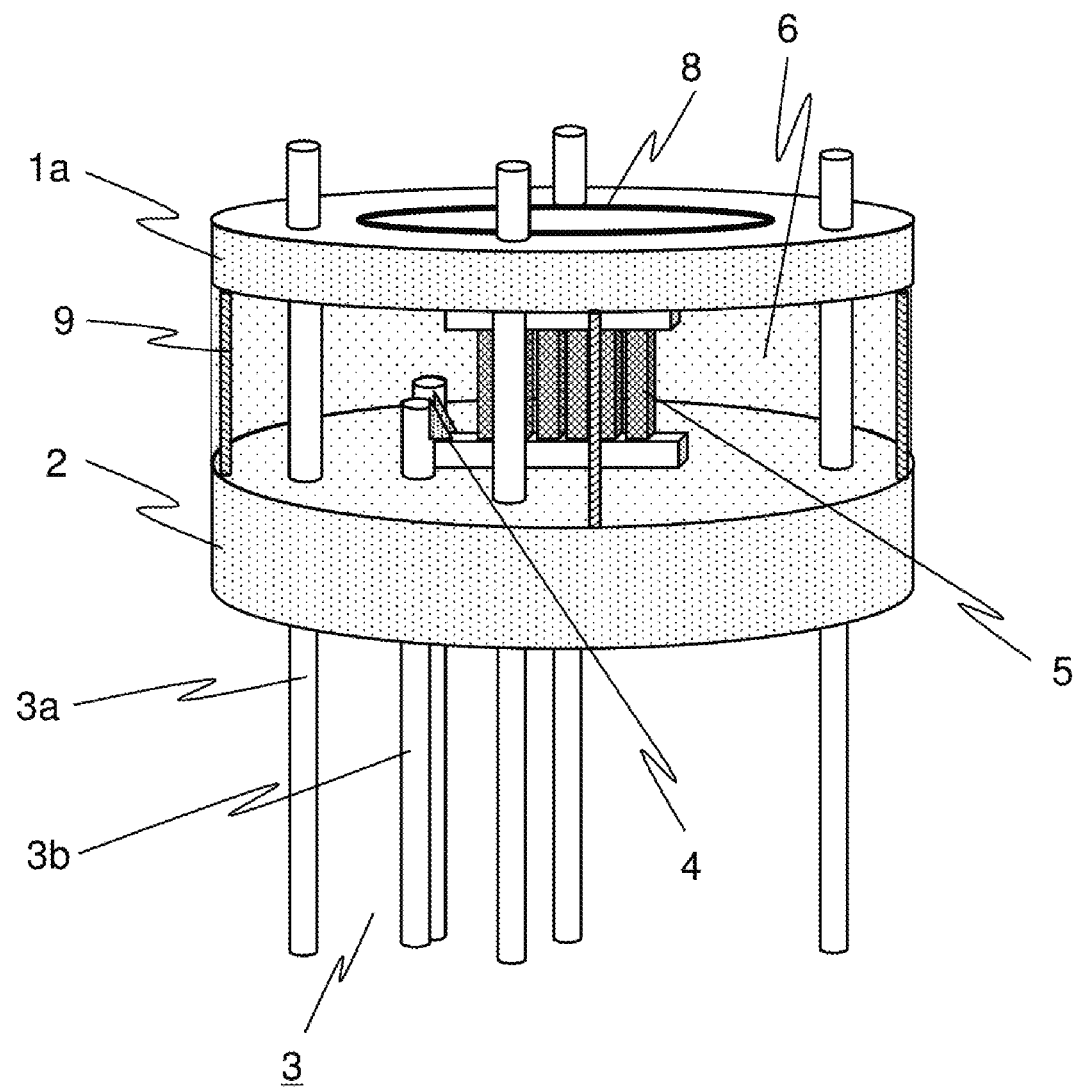
FIG. 7 is a diagram illustrating, by way of example, a thermoelectric cooler built-in stem according to Embodiment 3 of the present invention.

As shown in FIG. 7, the thermoelectric cooler built-in stem of the embodiment differs from the thermoelectric cooler built-in stem explained in Embodiment 2 in a point of the configuration in which reinforcement rods 9 are further provided additionally between the first stem member 1a and the second stem member 2. Other configurations and constituent items are the same. Those reinforcement rods 9 are placed on the plurality of rods basis as shown in the figure, and fixed by means of welding so as to link the first stem member 1a and the second stem member 2 together on the further perimeter sides to the placement positions of the leads each in those radial positions of the stem.

Those reinforcement rods 9 are rods which further reinforce, with respect to the thermoelectric cooler, the protection from disturbances by the leads extending through the first stem member 1 and the second stem member 2, and those by the insulating resin, and are rods which achieve the role of reinforcement materials for protecting the thermoelectric cooler 5 from disturbances such as a striking impact(s), vibrations and/or the like.

It should be noted that, in the figure, the exemplary explanation is made for the annular resin mold portion 8 that is formed in the first stem member; however, it is not necessarily limited to this. Similar effects can be achieved even by a first stem member in which the annular resin mold portion 8 is not formed therein as explained in Embodiment 1, when an influence of the external atmospheric air is small.

Next, the explanation will be made for the operations of the thermoelectric cooler built-in stem according to Embodiment 3.

As shown in FIG. 7, by providing the reinforcement rods 9 between the first stem member 1a and the second stem member 2, the protection from a viewpoint of the structural strength is made possible, in addition to the protection of the thermoelectric cooler 5 from a viewpoint of the structural strength by means of the insulating resin. According to this configuration, it is possible to protect the thermoelectric cooler 5 mounted inside the first stem member 1a and the second stem member 2, and the connection-point portion 4 mounted thereinside.

As explained above, in the thermoelectric cooler built-in stem according to the embodiment, the protection from disturbances such as a striking impact(s), vibrations and/or the like can be achieved by further reinforcing the components mounted between the first stem member 1a and the second stem member 2.

It should be noted that, in the present invention, each of the embodiments can be freely combined, and/or each of the embodiments can be appropriately modified or eliminated without departing from the scope of the invention. For example, the exemplary explanation is made for a first stem member and a second stem member which are placed in upward and downward directions (in the direction of gravity) in the manner described above; however, it is not necessarily limited to this. These members may be placed in left-hand and right-hand directions (directions perpendicular to the direction of gravity). In addition, the exemplary explanation is made for the plurality of leads which extends through the second stem member for supplying an electrical signal (s) to an optical module; however, it is not necessarily limited to this. A form may also be arranged in which leads do not extend through the first stem member, namely, upper ends of the leads are on the same face with the top face of the first stem member, or approximately on the same face therewith. Moreover, as for the number of the leads described above, the exemplary case has been shown for the number of four in the figures; however, it is not necessarily limited to this. Similar effects can be achieved when the number is only three or more.

EXPLANATION OF NUMERALS AND SYMBOLS

Numeral "1" and symbol "1a" each designate a first stem member; "2," second stem member; "3," "3a," "3b," lead; "4," connection-point portion; "5," thermoelectric cooler; "5a," thermoelectric element; "5b," substrate; "6," insulating resin; "7," optical component; "8," annular resin mold portion; "9," reinforcement rod; "10," LD chip; "11," first stem member's inner lateral portion; "12," first stem member's outer lateral portion; "15," extended contour line; and "30," external atmospheric air.

What is claimed is:

1. An optical module with a thermoelectric cooler built-in stem, comprising:
   a first stem member for mounting a temperature controlled target device on a top face of the first stem member further having an annular resin mold portion therein, being molded with a resin in a cylindrical shape, whose outer lateral portion in a cylindrical shape directly receiving an influence of a temperature of external atmospheric air;
   a second stem member being placed on a side of a bottom face of the first stem member, and sandwiching, in-between the first stem member, a thermoelectric cooler for performing temperature control of the temperature-controlled target device;
   an insulating resin surrounding the thermoelectric cooler, and also being filled between the first stem member and the second stem member;
   a lead extending through the second stem member and interconnecting the first stem member, and also supplying an electrical signal to the temperature-controlled target device; and
   other leads than said lead which are extending through the second stem member, and are joined to an anode and a cathode being electrodes of the thermoelectric cooler, wherein
   the annular resin mold portion is formed to extend through the first stem member in an across-a-thickness direction thereof, whereby the first stem member is thermally separated into the first stem member's outer lateral portion disposed outside of the annular resin mold portion in a ring and a first stem member's inner lateral portion disposed inside of the annular resin mold portion in a ring; and also an entirety of the thermoelectric cooler is placed at a position directly below the inside of the annular resin mold portion in a ring.

2. The optical module with a thermoelectric cooler built-in stem as set forth in claim 1, wherein a plurality of leads each extending through the first stem member and the second stem member is included for supplying an electrical signal to the temperature-controlled target device.

3. The optical module with a thermoelectric cooler built-in stem as set forth in claim 1, wherein
   the thermoelectric cooler includes a thermoelectric element taking on a support column, and substrates each for joining thereto the first stem member and the second stem member; and
   the thermoelectric cooler is connected to said other leads for supplying another electrical signal to the thermoelectric cooler by way of a connection-point portion.

4. The optical module with a thermoelectric cooler built-in stem as set forth in claim 1, further comprising: a reinforcement rod provided for linking the first stem member and the second stem member to each other.

5. The optical module with a thermoelectric cooler built-in stem as set forth in claim 1, wherein the first stem member has a structure for separating a portion on which a device to change its temperature is mounted, from a portion on which the device to change its temperature is not mounted.

6. The optical module with a thermoelectric cooler built-in stem as set forth in claim 2, wherein
   the thermoelectric cooler includes a thermoelectric element taking on a support column, and substrates each for joining thereto the first stem member and the second stem member; and
   the thermoelectric cooler is connected to said other leads for supplying another electrical signal to the thermoelectric cooler by way of a connection-point portion.

7. The optical module with a thermoelectric cooler built-in stem as set forth in claim 2, further comprising: a reinforcement rod provided for linking the first stem member and the second stem member to each other.

8. The optical module with a thermoelectric cooler built-in stem as set forth in claim 3, further comprising: a reinforcement rod provided for linking the first stem member and the second stem member to each other.

9. The optical module with a thermoelectric cooler built-in stem as set forth in claim 5, further comprising: a reinforcement rod provided for linking the first stem member and the second stem member to each other.

* * * * *